US005134343A

United States Patent [19]

Mathews

[11] Patent Number: 5,134,343

[45] Date of Patent: Jul. 28, 1992

[54] QUASI-OPTICAL GYROTRON HAVING AN ELECTRON GUN WITH ALTERNATING HIGH AND LOW DENSITY ELECTRON EMITTING SEGMENTS

[75] Inventor: Hans-Günter Mathews, Oberehrendingen, Switzerland

[73] Assignee: Asea Brown Boveri Ltd., Baden, Switzerland

[21] Appl. No.: 570,794

[22] Filed: Aug. 22, 1990

[30] Foreign Application Priority Data

Aug. 22, 1989 [CH] Switzerland ........................ 3046/89

[51] Int. Cl.[5] ........................ H01J 23/07; H01J 29/56; H03B 9/01

[52] U.S. Cl. ........................ 315/5; 315/5.31; 315/5.33; 313/338; 313/346 R; 313/352

[58] Field of Search ........................ 315/4, 5, 5.29, 5.31, 315/5.32, 5.33; 331/79; 313/338, 346 R, 353, 352; 333/227, 230; 372/2

[56] References Cited

U.S. PATENT DOCUMENTS 2,627,050 1/1953 Bezy ........................ 315/39 X
3,278,791 10/1966 Favre ........................ 315/3.5

FOREIGN PATENT DOCUMENTS 0004424 10/1979 European Pat. Off. .
0052047 5/1982 European Pat. Off. .
0157634 10/1985 European Pat. Off. .
1080710 6/1954 France .
2288384 5/1976 France .
664045 1/1988 Switzerland .

OTHER PUBLICATIONS

Proceedings of the Twelfth International Conference on Infrared and Millimeter Waves, Dec. 14–18, 1987, pp. 238–239, T. A. Hargreaves, et al., "The NRL Quasi--Optical Gyrotron Experiment".

Proceedings of the 13th International Conference on Infrared and Millimeter Waves, Dec. 5–9, 1988, pp. 279–280, M. E. Read, et al., "Design of a Quasi-Optical Gyrotron with a Sheet Electron Beam".

RCA Technical Notes, No. 1198, Feb. 3, 1978, pp. 1–3, I. Shidlovsky, "Dispenser Cathode with Limited Emitting Area".

Brown Boveri Review No. 6–1987, pp. 3–7, H. G. Mathews, et al., "The Gyrotron-A Key Component of High-Power Microwave Transmitters".

IEDM 83, pp. 448 to 451, IEEE 1983, L. R. Falce, "Dispenser Cathodes: The Current State of the Technology".

Int. Conf. on Microwave Tubes in Systems, Problems and Prospects, Oct. 22–23, 1984, pp. 35–41, B. Latini, et al., "Performance Analysis of Three Different M-Type Dispenser Cathodes".

*Primary Examiner*—Eugene R. LaRoche
*Assistant Examiner*—Benny T. Lee
*Attorney, Agent, or Firm*—Oblon, Spivak, McClelland, Maier & Neustadt

[57] ABSTRACT

For the purpose of generating an electron beam (5), a quasi-optical gyrotron comprises an electron-beam gun (1) with an annular cathode (2). The electron beam (5) passes along an electron beam axis (6) and in so doing is compressed by a static magnetic field and forced into gyration, so that it excites in a quasi-optical resonator a standing alternating electromagnetic field of specific wavelength. The resonator exhibits two mirrors (9*a*, 9*b*) arranged opposite to one another on a resonator axis (8) aligned perpendicular to the electron beam axis (6). In order to increase the efficiency of the gyrotron, the annular cathode (2) alternately exhibits segments of high and low emitting power such that the electron beam (5) has an azimuthally varying current density, values of low current density in the resonator coinciding spatially with nodal surfaces of the standing alternating electromagnetic field.

11 Claims, 1 Drawing Sheet

QUASI-OPTICAL GYROTRON HAVING AN ELECTRON GUN WITH ALTERNATING HIGH AND LOW DENSITY ELECTRON EMITTING SEGMENTS

BACKGROUND OF THE INVENTION

1. Field of the Invention

The invention relates to a quasi-optical gyrotron in which an electron-beam gun with an annular cathode generates an electron beam, which passes along an electron beam axis and in so doing is compressed by a static magnetic field and forced into gyration, so that it excites in a quasi-optical resonator, which exhibits two mirrors arranged opposite to one another on a resonator axis aligned perpendicular to the electron beam axis, a standing alternating electromagnetic field of specific wavelength.

2. Discussion of Background

A quasi-optical gyrotron of the type initially mentioned is known for example, from the Patent CH-664045 or from the article "Das Gyrotron, Schlüsselkomponente für Hochleistungs-Mikrowellensender" (The gyrotron, key component for high-power microwave transmitters), H. G. Mathews, Minh Quang Tran, Brown Boveri Review 6-1987, pages 303 to 307. Such a gyrotron operates at frequencies of typically 150 GHz and above and is capable of generating radiant powers of several hundred kilowatts in continuous-wave operation.

For electro-optical reasons, a gyrotron of the type mentioned has an annular electron beam. When this electron beam enters the resonator, a certain portion of the current passes through nodal surfaces of the standing alternating electromagnetic field, and thus contributes only insubstantially to the excitation of this field. On the other hand, at the antinodes of the standing alternating field, the azimuthal kinetic energy of the electron beam is largely converted into microwave energy. It is thus unavoidable that a certain proportion of the energy of the electron beam cannot be used.

This problem has already been recognized, and appropriate proposals for a solution have, moreover, already been made. In the publication "The NRL Quasi-optical Gyrotron Experiment", T. A. Hargreaves et al., Twelfth International Conference on Infrared and Millimeter Waves, Dec. 14–18, 1987, Lake Buena Vista (Orlando), Fla., Conference Digest by R. J. Temkin, pages 239 to 239, it is proposed to use an electron gun with a sheet beam to improve the efficiency, instead of a magnetron injection gun.

A concrete proposal for a sheet-beam gun is known, however, from the publication "Design of a Quasi-optical Gyrotron with Sheet Electron Beam", M.E. Read et al., Thirteenth International Conference on Infrared and Millimeter Waves, Dec. 5–9, 1988, Honolulu, Hawaii, Conference Digest by R. J. Temkin, pages 279 to 280. In this instance, several, strip-shaped cathode elements, which emit electrons and deliver the desired sheet beam, are arranged parallel to one another.

Although such an electron beam is capable of substantially enhancing the efficiency of a gyrotron, it is expensive to produce and requires a completely novel electron beam optical system. That is to say, the gyrotrons built to date are designed for a rotational symmetrical beam and cannot therefore directly be operated with the novel sheet-beam gun.

In aiming further to enhance the efficiency of the quasi-optical gyrotron, it is also necessary to be able to increase the current density of the electron beam. A significant step in this direction was made with the development of so-called mixed-metal matrix cathodes, such as are known, for example, from Patent EP 0,157,634 B1. The high current densities (above 10 A/cm$^2$) that mixed-metal matrix cathodes are capable of producing, and the compatibility with the conventional electron beam optical system enable an improvement of the total efficiency of the known gyrotron structure.

In this connection, reference is also to be made to the technology of impregnated cathodes and of so-called dispenser cathodes. An overview of this technology is given by the article "Dispenser Cathodes; The Current State of Technology", L. R. Falce, Hughes Aircraft Company, Electron Dynamics Division, Torrance, Calif., IEDM 83, pages 448 to 451, IEEE 1983. Finally, it is known from the article "Performance Analysis of three different M-Type Dispenser Cathodes", B. Latini, P. Cristini, I. Fragela and G. Marletta, Int. Conf. on Microwave Tubes in Systems, Problems and Prospects, London, Oct. 22–24, 1984, Conf. Publ. No. 241, pages 35 to 41, that the current density of the cathodes can be substantially enhanced by coating with suitable metals such as, for example, Os/Ru, Os/W, Ir and the like.

SUMMARY OF THE INVENTION

Accordingly, one object of this invention is to provide a novel gyrotron of the type initially mentioned, which is both capable of producing a high radiant power and also has high efficiency, and thus overcomes the disadvantages of known gyrotrons.

According to the invention, the solution consists in that the annular cathode alternately includes segments of high and low emitting power such that the electron beam has an azimuthally varying current density, values of low current density in the resonator coinciding spatially with nodal surfaces of the standing alternating electromagnetic field.

The segments are preferably constructed such that overall they essentially correspond to a superimposition of a periodic pattern of parallel strips with a circular ring. The period of the pattern advantageously corresponds to a product of the compression factor times half the wavelength or an integral multiple thereof. In this embodiment, the advantages of a sheet beam are optimally combined with those of the cylindrically symmetrical electron beam arrangement.

According to a preferred embodiment, the power emitted by the high power emitting segments is chosen at least twice as large as the power emitted by the low power emitting segments. A relevant increase in the efficiency can be ensured in this way.

In order to avoid too strong a concentration of the cathode current, the annular cathode is advantageously constructed in such a way that, in terms of area, the segments of high emitting power make up as large as possible a proportion of the cathode.

A cathode according to the invention can be produced in various ways. A first possibility consists in that a matrix cathode is selectively covered by a metal, such as an Os-containing mixed metal for example, that lowers the electron work function. The sites coated with the said metal then form the segments of high emitting power. The Os-containing layer is very easy to produce, (e.g. sputtering through an appropriately configured mask), and increases the emissivity by a factor of 2 to 5. The advantage in this embodiment resides in that the total current is very high and, as a result of the gentle transitions between segments of high and low emission, the energy of the electrons is distributed very homogeneously in the beam.

A second possibility consists in covering a matrix cathode selectively with an emission-inhibiting substance, that is to say a non-emitting or weakly-emitting material, e.g. with a Mo/Ru layer. The covered regions then form the segments of low emitting power. The advantage of this embodiment is the large ratio of high to low emitting power.

Finally, a third possibility is provided by a cathode composed of individual segments of different emissivity. The segments of low emitting power consist, e.g., of Mo and those of high emitting power of matrix cathode material. In this way, the regions of high and low emitting power are sharply separated from one another.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
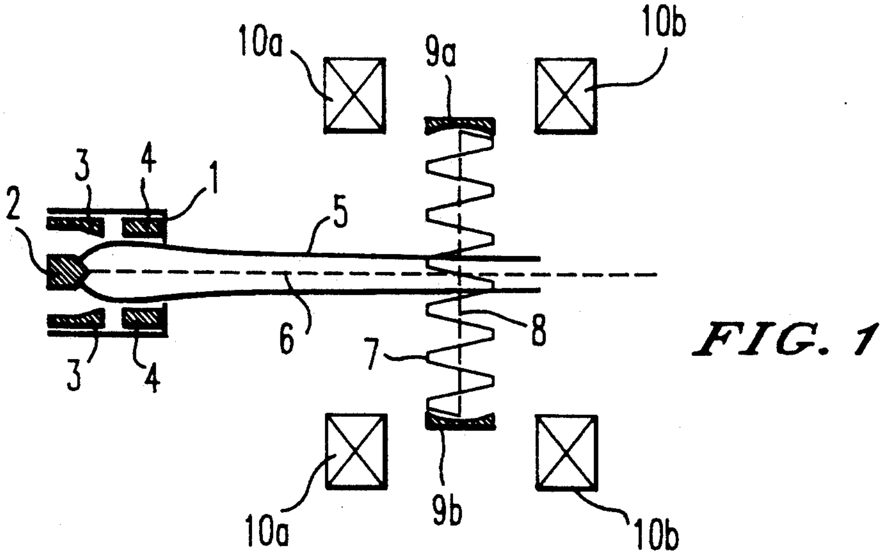
FIG. 1 shows a diagrammatic representation of a quasi-optical gyrotron in longitudinal section.

Referring now to the drawings, wherein like reference numerals designate identical or corresponding parts throughout the several views, FIG. 1 shows diagrammatically the parts of a quasi-optical gyrotron that are essential for explaining the invention. An electron-beam gun 1, which typically comprises a cathode 2, an auxiliary anode 3 and an anode 4 generates an electron beam 5. The electron beam 5 passes along an electron beam axis 6, is compressed by a magnetic field, which is generated by, e.g., two coils 10*a*, 10*b* in Helmholtz arrangement, and then enters a quasi-optical resonator. This is formed by two mirrors 9*a*, 9*b* opposite to one another on a resonator axis 8. The resonator axis 8 is essentially perpendicular to the electron beam axis 6.

The electrons of the electron beam 5, which are forced into gyration by virtue of the strong magnetic field, excite in the resonator a standing alternating electromagnetic field 7 of specific wavelength. The desired millimeter or submillimeter radiation is then coupled out from the resonator.

The aspects of the quasi-optical gyrotron described so far are sufficiently known from the prior art quoted at the beginning, and therefore require no further explanation at this point.

The electron gun 1, and in particular its cathode 2, is new. The latter is annular, and constituted in accordance with the invention such that the electron beam 5 has an azimuthally varying current density. In this arrangement the current density is relatively low in the nodal surfaces of the standing alternating field 7, and relatively high in the antinodes, i.e. in the regions of high electric field strength. For this purpose, the cathode 2 exhibits a plurality of segments with alternatingly high and low emitting powers.

Figure 2:
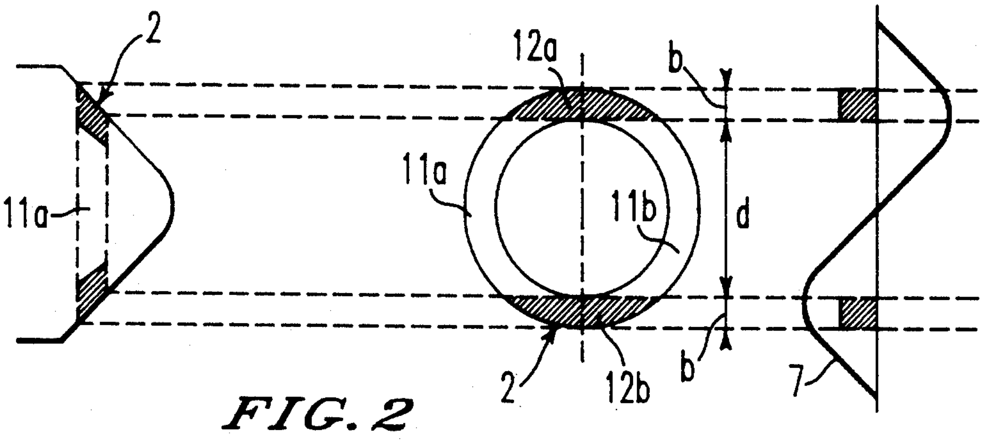
FIG. 2 shows a diagrammatic representation of a segmented, annular cathode with two strongly emitting segments.

FIG. 2 illustrates this state of affairs. By way of example, it shows an annular cathode 2 having in each case two segments of low and two segments of high emitting power 11*a*, 11*b* and 12*a*, 12*b*, respectively. As has already been indicated, the segments of low emitting power 11*a*, 11*b*, are constructed and aligned such that they produce in the resonator a relatively low current density in the nodal surfaces of the standing alternating field 7. Represented on the right-hand side of FIG. 2 is the amplitude of the standing alternating field 7, as it is "seen" from the cathode. In the present example, this means that a single nodal surface and two antinodes are considered in the segmentation of the cathode. The two segments of low emitting power 11*a*, 11*b* are equally large and symmetric to the electron beam axis 6 (which is perpendicular to the plane of the drawing in the central representation of FIG. 2). The segments of high emitting power 12*a*, 12*b* lying therebetween are to be maintained as large as possible, in order to avoid too strong a concentration of the current.

Essentially, the segments are produced when a periodic pattern of parallel strips (corresponding to the amplitude pattern of the alternating electromagnetic field) is superimposed upon a circular ring (corresponding to the cathode 2). In this arrangement, the pattern preferably has a period corresponding to the product of half the wavelength times the compression factor. In this arrangement, the compression factor specifies the ratio of the strength of the magnetic field at the site of the electron emitter (cathode) to that at the site of the resonator (interaction zone).

According to a preferred embodiment, the strips, which represent a region of high current density or high amplitude, respectively, of the alternating field (point-scanned strips), have a width b which corresponds approximately to the distance d separating the strips. The sum of the width b and distance d corresponds in this arrangement to the period of the pattern. The transition from a high to a low current concentration is then localized at a relative amplitude of approximately 0.7.

In order to reduce the current concentration, the width b can, however, easily be chosen larger and the mutual distance correspondingly smaller. Conversely, in order to increase the efficiency, the width b can be made very small and tuned to the maxima of the amplitude of the alternating field.

Figure 3:
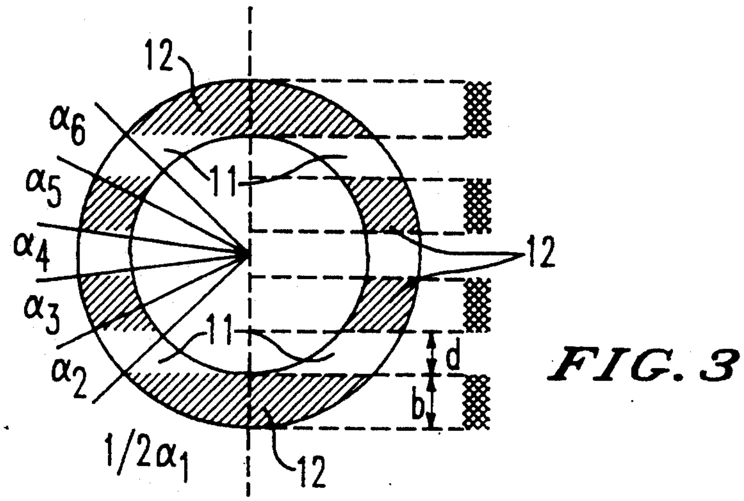
FIG. 3 shows a diagrammatic representation of a segmented, annular cathode with six strongly emitting segments.

FIG. 3 shows a further advantageous illustrative embodiment of the invention Here, the cathode has six segments 11 of low emitting power and six segments 12 of high emitting power. The strongly emitting segments 12 are marked in the figure by hatching. Again, the periodic pattern specified by the alternating field of the resonator is indicated in the right-hand half of the figure. A beam angle $\alpha_1$, $\alpha_2$, $\alpha_3$, $\alpha_4$, $\alpha_5$, $\alpha_6$ corresponding to each segment is given on the left-hand side.

With regard to as high an efficiency as possible, the following values, for example, are advantageous: $\alpha_1=64$, $\alpha_2=35$, $\alpha_3=10$, $\alpha_4=26$, $\alpha_5=3$, $\alpha_6=2$. Said values for the beam angle are produced due to the fact that the strongly emitting segments ($\alpha_1$, $\alpha_3$, $\alpha_5$)are chosen such that in the resonator the corresponding high current densities locally cover those regions of the alternating field which have a relative amplitude of at least 0.95. Consequently, the efficiency of the gyrotron is 90–95% of the theoretically possible efficiency.

It is to be noted that even with a few segments there is a substantial increase in efficiency. If, for example, with a cathode in accordance with FIG. 2 the ratio of high to low emissivity is approximately 3:1, the efficiency is already increased by a good 50% by contrast with a non-segmented cathode.

In operation, the nodal surfaces of the standing alternating electromagnetic field are tuned to the regions of low current density by adjusting the mirrors 9*a* and 9*b*

.

The number of the segments depends essentially upon the wavelength, the compression factor and the diameter of the annular cathode. According to the invention, at least two strongly emitting segments are to be provided. The number is bounded above by a minimum structural size conditioned by production. In any case, segmented cathodes are suitable downwards as far as wavelengths of approximately 1/10 mm.

A small numerical example is designed to provide an overall illustration. Assuming that the compression factor is approximately 20 and the wavelength 1 mm, it is then possible to consider with a cathode having a mean diameter of approximately 20 mm exactly two nodal surfaces, for example. In the case of a wavelength of 0.2 by contrast, approximately 20 nodal surfaces are considered. If approximately two segments of low emitting power are considered per nodal surface, such a cathode consists of approximately 40 segments of low emissivity, and an equal number of high emissivity.

A few preferred forms of implementation of a cathode according to the invention are described below.

According to a first embodiment, use is made as cathode of a matrix cathode covered locally by a substance, preferably by an Os-containing metal, that strongly promotes the emitting power. For the purposes of the invention, the last step in the production is to apply a layer of Os, locally structured in the sense of the invention (sputtering through a suitable mask). In this process, the regions of the cathode covered by Os form the segments of high emitting power. The uncovered regions lying therebetween have an emissivity that is lower by a factor of 2–4, and are tuned to the nodal surfaces.

Since the surface of such a cathode is virtually flat, the emerging electrodes all have approximately the same initial conditions, and thus form an electron beam with a fairly homogeneous energy distribution.

A further advantage resides in the fact that the last production step, that is to say the sputtering of Os through a suitably segmented mask, can be integrated without any problem into the normal production process of the matrix cathode. In particular, this embodiment is also well suited to finely segmented cathodes.

According to a second embodiment, for the purpose of a local reduction in the emitting power in the sense of the invention, a matrix cathode is covered selectively in a last production step with an emission-inhibiting layer, in particular with a Mo/Ru layer. The regions of the matrix cathode covered in this way do not emit, and therefore take optimum account of the nodal surfaces of the alternating field in the resonator.

If the Mo/Ru layer is applied subsequently, preferably with segments that are not too small, it is possible for pure, mass-produced matrix cathodes to be converted without high additional expense for the purposes of the invention.

According to a third embodiment, the cathode is composed of a plurality of parts. The parts, for example soldered or welded together, consist alternately of a material of high or low emitting power, respectively. Materials that are suitable in this sense are matrix cathode materials known per se. Mo and Mo alloys are likewise suitable.

In may be said in summary that the invention provides a way that is simple to follow of increasing the efficiency of known quasi-optical gyrotrons.

Obviously, numerous modifications and variations of the present invention are possible in light of the above teachings. It is therefore to be understood that within the scope of the appended claims, the invention may be practiced otherwise than as specifically described therein.

What is claimed as new and desired to be secured by Letters Patent of the United States is:

1. A quasi-optical gyrotron comprising:

a) an evacuated gyrotron chamber with a gyrotron main axis;

b) first means for emitting a beam of electron along an electron beam axis aligned parallel to said gyrotron main axis, said electron beam having a varying electron density which varies with distance perpendicular to said electron beam axis;

c) second mans aligned along said gyrotron main axis for generating a static magnetic field aligned parallel to said electron beam axis forcing said electron beam into gyration;

d) a quasi-optical resonator, aligned along said gyrotron main axis, including two mirrors arranged opposite to one another on a resonator axis aligned perpendicular to said electron beam axis, said electrons exciting an electromagnetic alternating field of a given frequency by gyration in said quasi-optical resonator, said electromagnetic alternating field consisting of a plurality of standing waves with nodal surfaces;

e) third means, coupled to said quasi-optical resonator, for coupling out electromagnetic radiation of said electromagnetic alternating field from said quasi-optical resonator;

f) said first means comprising an annular cathode having alternating segments of high ability of emitting electrons and low ability of emitting electrons resulting in said electron beam having an electron density which varies azimuthally, relative to said electron beam axis, with values of higher density formed by electrons emitted by said segments of high ability of emitting electrons and values of lower density formed by electrons emitted by said segments of low ability of emitting electrons; and g) said values of lower electron density in said quasi-optical resonator coinciding spatially with said nodal surfaces of the standing waves of said electromagnetic alternating field.

2. The quasi-optical gyrotron as claimed in claim 1 wherein said cathode comprises a matrix cathode and said segments of low ability of emitting electrons are formed by regions which are coated with an emission inhibiting material.

3. The quasi-optical gyrotron as claimed in claim 2 wherein said emission-inhibiting material comprises Mo/Ru.

4. The quasi-optical gyrotron as claimed in claim 1 wherein the segments comprise a periodic pattern of parallel strips arranged in a circular ring shape configuration.

5. The quasi-optical gyrotron as claimed in claim 4 wherein the periodic pattern has a period which corresponds to a product of a compression factor times half a wavelength of an integral multiple thereof.

6. The quasi-optical gyrotron as claimed in claim 4 wherein said segments of high ability of emitting electrons emit at least double an amount of electrons as said segments of low ability of emitting electrons.

7. The quasi-optical gyrotron as claimed in claim 4 wherein said cathode comprises at least two segments of high ability of emitting electrons and two segments of low ability of emitting electrons.

8. The quasi-optical gyrotron as claimed in claim 4 wherein said parallel strips have a width that approximately corresponds to a distance between said segments.

9. The quasi-optical gyrotron as claimed in claim 1 wherein said cathode comprises a matrix cathode and said segments of high ability of emitting electrons are formed by regions which are coated with an emission promoting material.

10. The quasi-optical gyrotron as claimed in claim 9 wherein said emission-promoting material comprises an Os-containing material.

11. The quasi-optical gyrotron as claimed in claim 1 wherein the cathode is a matrix cathode, and said segments of low and high ability of emitting electrons respectively are formed by parts of alternatingly different emitting ability that are soldered to one another.

* * * * *